United States Patent [19]

Blakeley et al.

[11] Patent Number: 5,122,743
[45] Date of Patent: Jun. 16, 1992

[54] APPARATUS AND METHOD OF NON-DESTRUCTIVELY TESTING FERROMAGNETIC MATERIALS INCLUDING FLUX DENSITY MEASUREMENT AND AMBIENT FIELD CANCELLATION

[75] Inventors: Philip J. Blakeley, Linton; Paul Ferrie, Cambridge, both of England

[73] Assignee: Castrol Limited, England

[21] Appl. No.: 471,796

[22] Filed: Jan. 29, 1990

[30] Foreign Application Priority Data

Jan. 28, 1989 [GB] United Kingdom ............... 8901903

[51] Int. Cl.$^5$ .................. G01N 27/87; G01N 27/84; G01R 33/12; G01R 33/025
[52] U.S. Cl. .................. 324/225; 324/216; 324/241; 324/260
[58] Field of Search ............... 324/214-216, 324/225, 227, 232, 234, 236-243, 258, 260, 229; 360/111, 115, 123

[56] References Cited

U.S. PATENT DOCUMENTS

| | | | |
|---|---|---|---|
| 2,957,129 | 10/1960 | Irwin | 324/238 |
| 3,246,219 | 4/1966 | Devol et al. | 360/111 |
| 3,617,874 | 11/1971 | Forster | 324/241 |
| 4,270,088 | 5/1981 | Weischedel | 324/241 |
| 4,430,615 | 2/1984 | Calvert | 324/241 X |
| 4,901,015 | 2/1990 | Pospischil et al. | 324/174 X |

FOREIGN PATENT DOCUMENTS 3143 1/1971 Japan ..................... 324/241

OTHER PUBLICATIONS

McMaster, R. C.; Thickness Tests, Non-Destructive Testing Handbook, vol. II; The Ronald Press, 1963; pp. 34.15-34.18.

Primary Examiner—Gerard R. Strecker
Attorney, Agent, or Firm—Bacon & Thomas

[57] ABSTRACT

Apparatus for measuring flux density within the surface of a ferromagnetic material (24) includes a probe (10) having an end for location on or adjacent the surface of the material (24), a first sensor at the said end of the probe (10) and capable of producing a first output signal representative of the strength of the magnetic field to which said first sensor is subjected, and a second sensor at the remote end of the probe (10) and capable of producing a second output representative of the strength of the magnetic field to which said second sensor is subjected. An electronic circuit produces a difference signal representing the difference between the first and second outputs, and an output device (14) displays and/or records said difference signal (16). The probe (10) preferably includes two magnetically susceptible C-cores (18, 20) and a coil (22) wound in one rotational sense on the crosspiece of one core (18) and in the opposite rotational sense on the crosspiece of the other core (20) to produce the difference signal. The magnetic flux can be measured for materials subjected to static or time-varying magnetic fields.

12 Claims, 1 Drawing Sheet

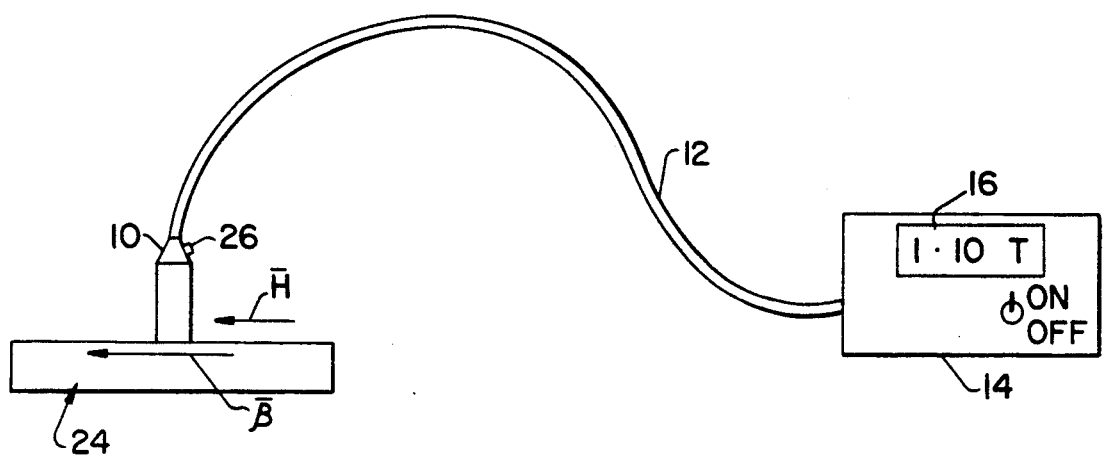
FIG. 1
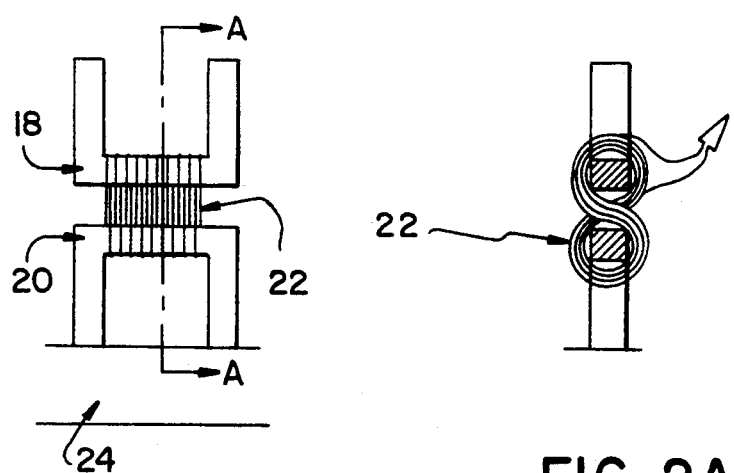
FIG. 2
FIG. 2A

APPARATUS AND METHOD OF NON-DESTRUCTIVELY TESTING FERROMAGNETIC MATERIALS INCLUDING FLUX DENSITY MEASUREMENT AND AMBIENT FIELD CANCELLATION

This invention relates to apparatus for and a method of measuring the magnetic flux density associated with ferromagnetic material excited by a static or time-varying magnetic field.

Magnetic Particle Inspection (MPI) is commonly carried out on components made from ferromagnetic material. The procedure calls for the component to be magnetised, whereupon a magnetic ink is sprayed over the region of interest. Any cracks present in the component produce a strong leakage of the magnetic field which attracts the magnetic ink, thus allowing any defects in the component to be identified.

The MPI technique is specified in the UK in British Standard BS6072, which calls for the value of the magnetic flux density present in the component under inspection to be 0.72 Tesla. In practise it has been found difficult to measure the magnetic flux density B in the component and many inspection procedures either make a very crude measurement of this value or rely on measuring the magnetic field H in air around the component. This practice means that BS6072 is often not strictly complied with. As a result, actual defects may not be detected, or conversely, spurious indications may be seen where no defects actually occur.

An object of the present invention is to provide a means of producing a quantitative measurement of the magnetic flux density within a component. This enables MPI to be carried out as specified in BS6072. Also, since quantitative values of the magnetic flux density can be recorded, the inspection can be repeated, if necessary, under the same magnetic conditions.

The invention also allows different methods of magnetisation to be compared, including alternating or static magnetising techniques.

According to one aspect of the invention, there is provided apparatus for measuring flux density within the surface of a ferromagnetic material excited by a magnetic field, comprising a probe having one end for location on or adjacent the surface of the test material, first sensor means at said one end of the probe and capable of producing a first output signal representative of the strength of the magnetic field to which said first sensor means is subjected, second sensor means at the remote end of the probe and capable of producing a second output representative of the strength of the magnetic field to which said second sensor means is subjected, circuit means for producing a difference signal representing the difference between the first and second outputs, and means for displaying and/or recording said difference signal.

The apparatus may be calibrated by testing a material of known flux density.

A preferred construction of probe comprises two magnetically susceptible C-cores, preferably of ferromagnetic material, and a coil wound in one rotational sense on the crosspiece of one core and in the opposite rotational sense on the crosspiece of the other core.

Preferably a single wire is employed to form the coils, being wound in a figure-of-eight starting at one core and finishing at the other. The required difference signal can be obtained directly between leads connected to the beginning and the end of the figure-of-eight coiled wire, the signal being suitably processed before display and/or recording. It will be understood that the output from the probe will, in this arrangement, be an induced voltage arising due to any imbalance between the magnetic flux (associated with the material under test) which passes through the C-cores.

The C-cores may be made of laminated silicon iron and the figure-of-eight coil may comprise one hundred or so complete turns of thin wire.

The end of the probe for contacting the test material, i.e. the contact poles of the one C-core, may be shaped to fit the surface under inspection.

The afore-described apparatus meets a particular requirement in magnetic particle inspection where components need to be magnetised to a known value of the internal flux density.

Such a device needs to be capable of measuring the flux density derived from static magnetic fields such as those produced, for example, by permanent magnets or direct current (DC), and also time varying magnetic fields such as those resulting from alternating currents in cables or generated by winding AC carrying wire around a laminated yoke. The device should also be capable of measuring peak magnetic field levels from non-sinusoidal time varying fields such as those produced by thyristor chopped power supplies.

According to another aspect of the invention, therefore, there is provided a method of magnetic flux measurement using the afore-described differential probe wherein, in the case of a test material subject to a static magnetic field, the voltage output of the probe (difference signal) is integrated while the probe is moved from a position remote from the test material to a position on or adjacent the test material.

According to another aspect of the invention, there is provided a method of magnetic flux measurement using the afore-described differential probe wherein, in the case of a test material subject to a time-varying magnetic field, the voltage output of the probe is integrated over a given period while the probe is held on or adjacent the test material, and the integrated voltage signal is rectified before being passed to peak detecting (AC) circuit and/or an averaging (DC) circuit.

One embodiment of the invention and method of use thereof are given by way of example in the following description, referring to the accompanying drawings, in which, FIG. 1 is a diagrammatic view of the apparatus; and
FIGS. 2 and 2A show details of the probe, FIG. 2A being a cross-section in the plane A—A indicated in FIG. 2.

Referring to FIG. 1, a probe 10 is connected by a signal lead 12 to a housing 14 containing monitoring and processing electronics and having a display device 16.

The probe 10 consists of two C-cores 18, 20 made typically of ferrite and a plurality, typically about one hundred, of turns of thin wire wound around the ferrite cores, in the manner shown in FIGS. 2 and 2A. The wire is wound around both cores, clockwise around one core and anti-clockwise around the other, in a figure-of-eight shape. A voltage signal is received from the coil 22 whenever there is a change in the magnetic field linking the ferrite cores. However, if a magnetic field is applied equally to the two C-cores no difference voltage is produced, since the induced emf in the portion of the coil surrounding one core is cancelled out exactly by the induced emf in the portion of the coil surrounding the other core.

Thus, a voltage signal from the probe will result only if the flux change through one core is different from the flux change through the other. This will occur, for example if the probe is positioned so that only one of the C-cores makes contact with the surface of a magnetised piece of steel. The C-core is made from material of high relative permeability (typically 500) and high saturation levels (typically 2 Tesla), so that it does not strongly influence the magnitude of any changes in magnetic flux passing through the core. The value of the magnetic flux through the C-cores is influenced by the flux density B within the component 24 under inspection. There is therefore no requirement to measure either the magnetic permeability of the material under inspection or the magnetic field H applied to the material. The monitoring electronics can give a reading of the flux density present in the surface under inspection.

The electronics monitoring the induced voltages from the C-cores can operate in several modes. In one mode, where the field in the material to be inspected is static, such as that produced by direct current (DC) windings or by permanent magnets, the voltage output from the probe is integrated whilst the probe is brought from a position remote from the inspection point up to the inspection point.

If the value of the magnetic flux at the starting position is so low that it can be assumed to be zero, the integrated voltage signal of the probe is indicative of the flux passage through one of the C-cores in the probe. This in turn is proportional to the flux density within the material under inspection.

It may first be necessary to calibrate the probe using material in which known flux density is present.

In a second mode, where there is a time varying magnetic field present in a magnetizable material, such as that produced by alternating current in cables placed near a piece of steel or where electromagnets are powered by alternating current, then the probe is placed upon the material. The voltage produced by the probe will vary with the same periodicity as that of the driving field.

A signal representing the magnetic flux density is obtained by integrating the voltage across the coil. This signal is rectified before being passed to peak detecting (AC) or averaging (DC) circuits, the result of which is displayed on a liquid crystal display. Conveniently, the display is latched for a period of typically 5 seconds after pressing a start button 26. The probe can then be removed from the test position and the recorded value for the flux density retained by the display.

Again, a calibration of the probe may be required using materials with a known applied time varying field.

Thus, in both operating modes, the probe acts as a shunt to the magnetic flux present in the surface of the test material and is useful where measurements of the surface flux are required.

If a surface is coated and therefore the probe cannot make intimate contact with the surface of the test material, then the probe provides a reading corresponding to the flux density at the external surface of the coating.

The probe faces in contact with the surface under measurement may be shaped to make good contact, e.g. to fit curved surfaces of pipes.

The devices may be used to show both the magnitude and direction of the magnetic flux density at the surface of ferromagnetic materials such as metals containing iron or nickel or cobalt and their alloys and also non-metals such as ferrites. This information measured by the apparatus is useful in providing quantitative information for use in non-destructive testing of materials and components, and especially for magnetic particle inspection.

In addition, the probe can be used to detect whether or not magnetic flux is present inside a piece of material such as carbon steel, thereby to determine whether or not it can be successfully welded (if the flux density is too high then the welding arc is disrupted).

Moreover, if the material under inspection is placed in a known magnetic field H then a measurement of B, using the above-described device, will enable the relative permeability of the material $\mu_r$ to be determined by the relationship:

$$B = \mu_0 \mu_r H$$

where $\mu_0$ is a constant (the permeability of free space).

Various modifications of the above-described and illustrated apparatus are possible within the scope of the described invention.

We claim:

1. Apparatus for measuring flux density within the surface of a ferromagnetic material excited by a magnetic field, comprising a probe having one end for location on or adjacent the surface of the test material; first sensor means at said one end of the probe and capable of shunting magnetic flux in the surface through said first sensor means, said first sensor means having no separate driving source and being subjected to a magnetic field resulting solely from the flux shunted through said first sensor means and to an ambient magnetic field, and producing a first output signal representative of the strength of the magnetic field to which said first sensor means is subjected; a second end remote from said surface; second sensor means at the second end of the probe and capable of producing a second output representative of the strength of said ambient magnetic field to which said second sensor means is alone subjected; circuit means for producing a difference signal representing the difference between the first and second outputs; and means for displaying and/or recording said difference signal.

2. Apparatus according to claim 1, wherein each sensor means comprises a magnetically susceptible C-core and a coil wound in one rotational sense on the cross piece of one core and in the opposite rotational sense on the cross piece of the other core.

3. Apparatus according to claim 2, wherein a single wire is employed to form the coil, the wire being wound in a figure-of-eight starting at one core and finishing at the other.

4. Apparatus according to claim 3, wherein the required difference signal is obtained directly between leads connected to the beginning and the end of the figure-of-eight coiled wire, the signal being suitably processed before display and/or recording.

5. Apparatus according to claim 2, wherein the output from the probe is the induced voltage arising due to any imbalance between the magnetic flux (associated with the material under test) which passes through the C-cores.

6. Apparatus according to claim 2, wherein the C-cores are made of laminated silicon iron.

7. Apparatus according to claim 2, wherein the C-cores are made of ferrite.

8. Apparatus according to claim 1, wherein the end of the probe for contacting the test material is shaped to fit the surface under inspection.

9. A method of measuring the magnetic flux of a material subject to a static magnetic field and using apparatus according to claim 1, the method comprising integrating the voltage output of the probe (difference signal) while the probe is moved from a position remote from the material to a position on or adjacent the material.

10. A method according to claim 9, wherein the apparatus is calibrated by testing a material of known flux density.

11. A method of measuring the magnetic flux of a material subject to a time-varying magnetic field and using apparatus according to claim 1, the method comprising integrating the voltage output of the probe over a given period while the probe is held on or adjacent the material, and rectifying the integrated voltage signal before the signal is passed to a peak detecting (AC) circuit and/or an averaging (DC) circuit.

12. A method according to claim 11, wherein the apparatus is calibrated by testing a material of known flux density.

* * * * *